(12) United States Patent
Luo et al.

(10) Patent No.: US 9,679,905 B1
(45) Date of Patent: Jun. 13, 2017

(54) INTEGRATED CIRCUITS WITH NON-VOLATILE MEMORY AND METHODS OF PRODUCING THE SAME

(71) Applicant: Globalfoundries Singapore Pte. Ltd., Singapore (SG)

(72) Inventors: Laiqiang Luo, Singapore (SG); Yew Tuck Clament Chow, Singapore (SG); Fan Zhang, Singapore (SG); Huajun Liu, Singapore (SG); Dong Wang, Singapore (SG); Danny Pak-Chum Shum, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/094,555

(22) Filed: Apr. 8, 2016

(51) Int. Cl.
| | |
|---|---|
| H01L 21/28 | (2006.01) |
| H01L 27/11 | (2006.01) |
| H01L 27/11556 | (2017.01) |
| H01L 27/11582 | (2017.01) |
| H01L 29/423 | (2006.01) |
| H01L 21/66 | (2006.01) |
| H01L 27/1157 | (2017.01) |
| H01L 27/11524 | (2017.01) |
| H01L 27/11529 | (2017.01) |
| H01L 27/11573 | (2017.01) |
| H01L 27/11565 | (2017.01) |
| H01L 27/11519 | (2017.01) |
| H01L 21/3213 | (2006.01) |
| H01L 21/285 | (2006.01) |

(52) U.S. Cl.
CPC .. *H01L 27/11556* (2013.01); *H01L 21/28525* (2013.01); *H01L 21/28556* (2013.01); *H01L 21/32136* (2013.01); *H01L 22/26* (2013.01); *H01L 27/1157* (2013.01); *H01L 27/11519* (2013.01); *H01L 27/11524* (2013.01); *H01L 27/11529* (2013.01); *H01L 27/11565* (2013.01); *H01L 27/11573* (2013.01); *H01L 27/11582* (2013.01); *H01L 29/42332* (2013.01); *H01L 29/42348* (2013.01)

(58) Field of Classification Search
CPC . H01L 2924/01079; H01L 2924/01078; H01L 2924/01013; H01L 2924/01029; H01L 2224/48; H01L 2224/48; H01L 2224/48091; H01L 29/42; H01L 29/423; H01L 29/42332; H01L 29/42348; H01L 27/11; H01L 27/115; H01L 27/1157; H01L 27/11524; H01L 27/11529; H01L 27/11565; H01L 27/11519; H01L 27/11582; H01L 21/28; H01L 21/285; H01L 21/32; H01L 21/32136
USPC .................................................. 257/314, 720
See application file for complete search history.

(56) References Cited

U.S. PATENT DOCUMENTS

2012/0052670 A1* 3/2012 Shroff ............... H01L 21/28273
438/591

* cited by examiner

*Primary Examiner* — Monica D Harrison
(74) *Attorney, Agent, or Firm* — Lorenz & Kopf, LLP (57) ABSTRACT

Integrated circuits and methods of producing the same are provide. In an exemplary embodiment, a method includes determining a memory area of the integrated circuit, and forming a select layer overlying the substrate. A portion of the select layer is selectively etched to form a select gate within the memory area. A concentration of an indicator is measured in an etch off-gas during the selective etching of the select layer, and the selective etching of the select layer is terminated when the concentration of the indicator crosses an end point determination concentration.

19 Claims, 6 Drawing Sheets

INTEGRATED CIRCUITS WITH NON-VOLATILE MEMORY AND METHODS OF PRODUCING THE SAME

TECHNICAL FIELD

The technical field generally relates to integrated circuits with non-volatile memory and methods of producing the same, and more particularly relates to integrated circuits with dummy gates and non-volatile memory, and methods of producing the same.

BACKGROUND

The semiconductor industry is continuously moving toward the fabrication of smaller and more complex microelectronic components with higher performance. Market pressures are driving the industry to produce smaller components, but there is also significant market pressure to reduce costs while making smaller components. There are numerous steps in the manufacture of many integrated circuits, and each step has an associated cost. Integrated circuits and methods of production that improve quality without requiring significant additional steps can reduce waste and improve reliability.

Many integrated circuits include memory cells to store information, and the memory cells are becoming smaller and more complex along with the rest of the microelectronic components. There are several different types of memory cells, including flash memory that is both non-volatile and re-writable. Non-volatile memory retains stored information even when the memory cell is de-powered, and stored information can be changed when a memory cell is re-writable. Non-volatile memory cells that utilize silicon nanocrystals are included in some integrated circuits, where the memory cells include a memory layer positioned between a select gate and a control gate. The memory layer may include nanocrystals, and the memory cell is read by determining if the nanocrystals have a stored charge or not. The select gate and the control gate are used for reading the memory cell by determining if the nanocrystals have a stored charge, and writing to the memory cell by charging or draining the charge from the memory cell. In some embodiments, the formation process includes a timed etch to form the select gate. The timed etch may not be as accurate or precise as an etch with an end point detection (e.g., an indicator gas that can be detected during the etch), but the relatively small area used for non-volatile memory in some integrated circuits does not produce sufficient indicator gases during the etch to detect the end point of the etch. The timed etch can result in an inaccurate etch that may damage the substrate or leave a coating over the substrate that interferes with operation of the memory cells.

Accordingly, it is desirable to provide methods for producing integrated circuits with a more accurate etch process for forming the select gate, and it is also desirable to provide integrated circuits produced by such methods. In addition, it is desirable to provide methods for detecting the end point of a select gate etch even when the integrated circuit area devoted to the non-volatile memory is low, and integrated circuits produced by such methods. Furthermore, other desirable features and characteristics of the various embodiments will become apparent from the subsequent detailed description and the appended claims, taken in conjunction with the accompanying drawings and this background of the invention.

BRIEF SUMMARY

Integrated circuits and methods of producing the same are provide. In an exemplary embodiment, a method includes determining a memory area of the integrated circuit, and forming a select layer overlying the substrate. A portion of the select layer is selectively etched to form a select gate within the memory area. A concentration of an indicator is measured in an etch off-gas during the selective etching of the select layer, and the selective etching of the select layer is terminated when the concentration of the indicator crosses an end point determination concentration.

In another embodiment, a method is provided for producing an integrated circuit. The method includes determining a memory area and a dummy area of the integrated circuit. A select layer is formed overlying the substrate, including over the memory area and the dummy area. A portion of the select layer is removed to form a select gate in the memory area, where the select layer is simultaneously removed from at least a portion of the dummy area. A non-volatile memory cell that includes the select gate is formed.

An integrated circuit is provided in yet another embodiment. A non-volatile memory cell overlies a substrate, where the non-volatile memory cell includes a control gate and a select gate. The select gate overlies a gate dielectric, and the gate dielectric overlies the substrate. A dummy gate also overlies the substrate. A memory layer is disposed between the dummy gate and the substrate, where the memory layer includes nanocrystals, and the memory layer is also disposed between the control gate and the select gate.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based integrated circuits are well-known and so, in the interest of brevity, many conventional steps will only be mentioned briefly herein or will be omitted entirely without providing the well-known process details.

In accordance with embodiments of a method as described herein, an end point in an etch process may be detected by measuring changes in the concentration of an indicator in the off-gas, where the indicator is produced during etching. A minimum area of the integrated circuit generally has to be etched to produce sufficient quantities of the indicator for reliable measurement. As used herein, the term "area" means an area of a plane that is parallel with a surface of a substrate of the integrated circuit. The substrate is more fully described below. In some integrated circuits, the area used for memory cells is not sufficient for off-gas end point detection techniques during some of etching processes. As such, in accordance with embodiments described herein, dummy areas may be etched along with the area used for memory cells to increase the total area of the etch such that off-gas end point detection techniques can be effectively used.

Figure 1:
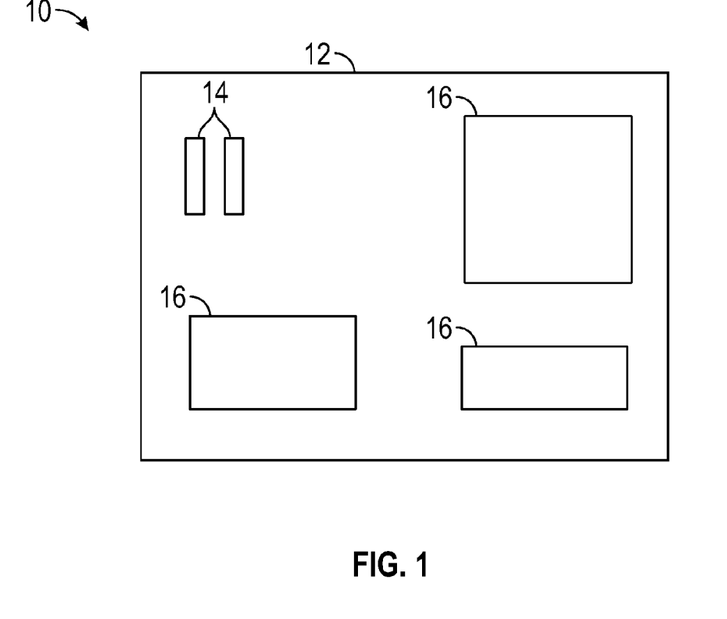
FIG. 1 illustrates a top view of an integrated circuit, where areas of the integrated circuit are shown.

Referring to an exemplary embodiment illustrated in FIG. 1, an integrated circuit 10 has an integrated circuit area 12, where the integrated circuit area 12 is the area of the integrated circuit 10 as a whole. A memory area 14 and a dummy area 16 may be selected from within the integrated circuit 10, where the memory area 14 is an area that primarily includes memory cells such that memory cells are more than 50 percent of the electrical components in the memory area 14. The dummy area 16 is an area that is not actively used by the integrated circuit 10, so any components in the dummy area 16 could be removed without influencing the operation of the integrated circuit 10. The memory area 14 may not be contiguous for the integrated circuit 10, so references to the memory area 14 are meant to include the sum of all the memory areas 14 in the integrated circuit. The dummy area 16 also may not be contiguous, so references to the dummy area 16 includes the sum of all the dummy areas 14 within the integrated circuit. Any area that is included in the memory area 14 or the dummy area 16 is about 100 square micrometers or more, so small areas (less than 100 square micrometers) that may fit the definitions given above are not included in the memory or dummy areas 14, 16. In some embodiments, the memory area 14 is less than about 20 percent of the integrated circuit area 12, and the memory area 14 may be less than about 10 percent of the integrated circuit area 12 or less than about 5 percent of the integrated circuit area 12 in other embodiments. In this description, area percentages are based on the integrated circuit area 12 unless otherwise specified. The dummy area 16 may be about 20 percent or more of the integrated circuit area 12 in some embodiments, and the dummy area 14 may be about 30 percent or more of the integrated circuit area 12 or about 40 percent or more of the integrated circuit area 12 in other embodiments. In yet other embodiments, the sum of the memory area 14 and the dummy area 16 may be about 20 percent or more or the integrated circuit area 12, or about 30 percent or more of the integrated circuit area 12 or about 40 percent or more of the integrated circuit area 12.

The detection of an end point for some etch processes requires the detection of an indicator atom or compound in an etch off-gas, as mentioned above. The concentration of the indicator may rise above or fall below an end point determination concentration in various embodiments, so when the concentration of the indicator crosses the end point determination concentration the etch process can be terminated. In some embodiments, when the area being etched is less than a required area, the concentration of the indicator in the off-gas is too small for reliable measurement such that the end point cannot be reliably determined based on measurement of the concentration of the indicator. In an exemplary embodiment, if the area of an etch process is less than about 20 percent of the integrated circuit area 12, measurement of the concentration of the indicator is not viable to determine the end point for an etch process. In alternate embodiments, measurement of the concentration of an indicator is not viable to detect an end point of an etch process if the area of an etch process is less than about 10 percent of the integrated circuit area 12 or less than about 30 percent of the integrated circuit area 12. The material being etched, the type of etch, the energy of the etch, the detection limit for the indicator, and other factors can influence the total area of an etch process that is needed to detect an end point based on measurement of an indicator. The indicator is typically measured in the off-gas from an etch process, so end point detection by measurement of an indicator is viable for reactive ion etch processes or other dry etch processes that produce an off-gas.

Figure 2:
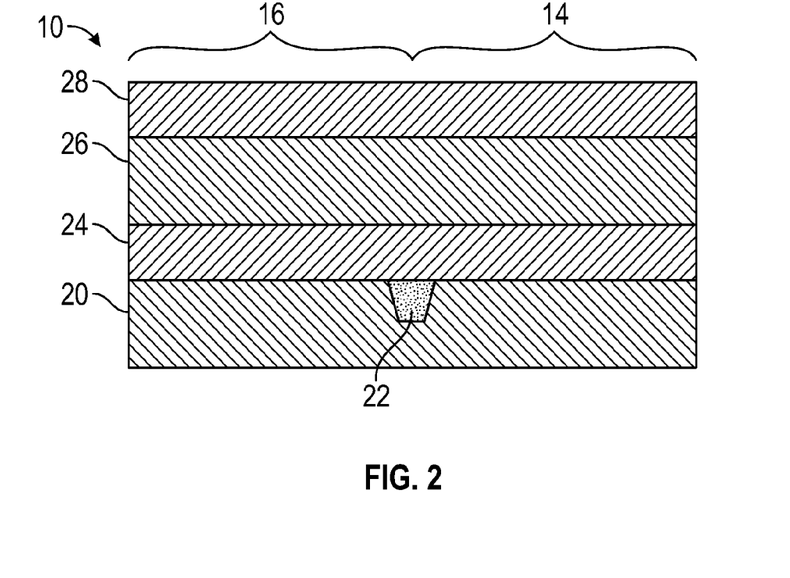
FIGS. 2-11 illustrate, in cross sectional views, an integrated circuit and methods for fabricating the same in accordance with exemplary embodiments.

Reference is made to the exemplary embodiment in FIG. 2. The integrated circuit 10 includes a substrate 20 including semiconductor material, and areas described herein are in a plane that is parallel with the substrate 20 unless otherwise specified, as mentioned above. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 20 primarily includes a monocrystalline semiconductor material. The substrate 20 may be a bulk silicon wafer (as illustrated) or may be a thin layer of silicon on an insulating layer (commonly known as silicon-on-insulator or SOI, not illustrated) that, in turn, is supported by a carrier wafer.

A shallow trench isolation 22 may optionally be formed in the substrate 20, where the shallow trench isolation 22 includes an electrically insulating material. As used herein, an "electrically insulating material" is a material with a resistivity of about $1 \times 10^4$ ohm meters or more, and an "electrically conductive material" is a material with a resistivity of about $1 \times 10^4$ ohm meters or less. In an exemplary embodiment, the shallow trench isolation 22 includes silicon dioxide, which may be formed by chemical vapor deposition using silane and oxygen, but other materials or other techniques of formation may be used in alternate embodiments. In an exemplary embodiment, the shallow trench isolation 22 serves as a border between the memory area 14 and the dummy area 16, but in alternate embodiments the border does not include a shallow trench isolation 22.

A gate dielectric layer 24 is formed overlying the substrate 20 and the optional shallow trench isolation 22 in some embodiments. The gate dielectric layer 24 includes an insulating material, and may include silicon dioxide in some embodiments. As used herein, the term "overlying" means "over" such that an intervening layer may lie between the gate dielectric layer 24 and the substrate 20, or "on" such that the gate dielectric layer 24 physically contacts the substrate 20. Moreover, the term "directly overlying" means a vertical line passing through the upper component also passes through the lower component, such that at least a portion of the upper component is directly over at least a portion of the lower component. It is to be understood that the integrated circuit 10 may be moved such that the relative "up" and "down" positions change, so reference to a "vertical" line means a line that is about perpendicular to the surface of the substrate 20. Silicon dioxide can be deposited by chemical vapor deposition using silane and oxygen. A select layer 26 may be formed overlying the gate dielectric layer 24, where the select layer 26 may include polysilicon. Polysilicon may be formed by low pressure chemical vapor deposition in a silane environment. A conductor layer 28 may be formed overlying the select layer 26, where the conductor layer 28 is electrically conductive. In an exemplary embodiment, the conductor layer 28 includes a metal, such as titanium, but other metals may be used in alternate embodiments. Titanium may be deposited by low pressure chemical vapor deposition of titanium pentachloride, but other techniques may be used in alternate embodiments. As such, the gate dielectric layer 24, the select layer 26, and the conductive layer 28 overlie the substrate 20 in the memory area 14 and the dummy area 16, and may overlie the substrate 20 in other areas as well.

Figure 3:
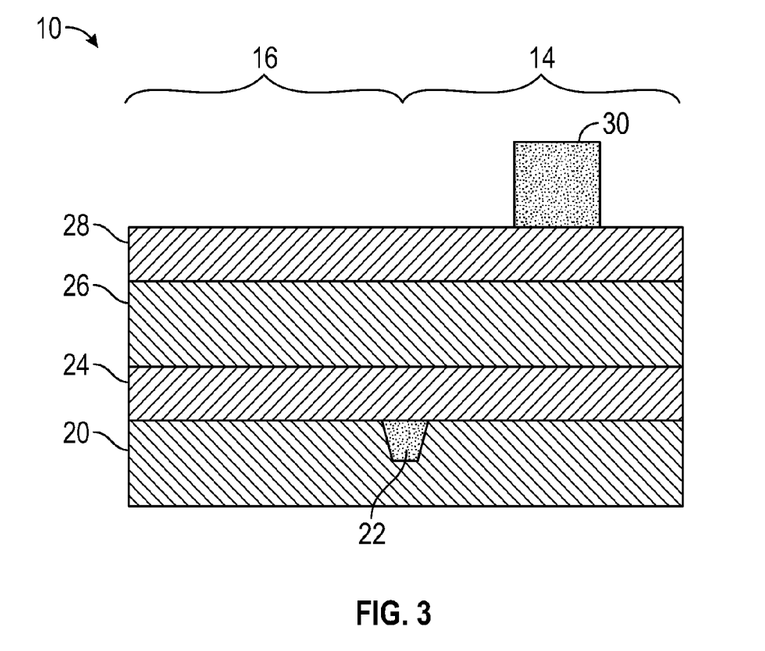

A select photoresist 30 may be formed overlying the conductor layer 28, as illustrated in an exemplary embodiment in FIG. 3. The select photoresist 30 (and other photoresist layers described below) may be deposited by spin coating, and patterned by exposure to light or other electromagnetic radiation through a mask with transparent sections and opaque sections. The light causes a chemical change in the select photoresist 30 such that either the exposed portion or the non-exposed portion can be selectively removed. The desired locations may be removed with an organic solvent, and the select photoresist 30 remains overlying the other areas of the conductor layer 28, the select layer 26, and the gate dielectric layer 24. The select photoresist 30 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane. The select photoresist 30 (and any associated hard mask, not illustrated) may be patterned to expose portions of the conductor layer 28 in the memory area 14 and in the dummy area 16 of the integrated circuit 10. The select layer 26 may be exposed by etching exposed portions of the conductor layer 28. In an exemplary embodiment, the select photoresist 30 is patterned to expose a surface area of the conductor layer 28 of about 20 percent or more of the integrated circuit area 12 (as seen in FIG. 1). In alternate embodiments, a surface area of the select layer 26 of about 10 percent or more of the integrated circuit area 12, or about 30 percent or more of the integrated circuit area 12, is exposed after etching the conductor layer 28.

Figure 4:
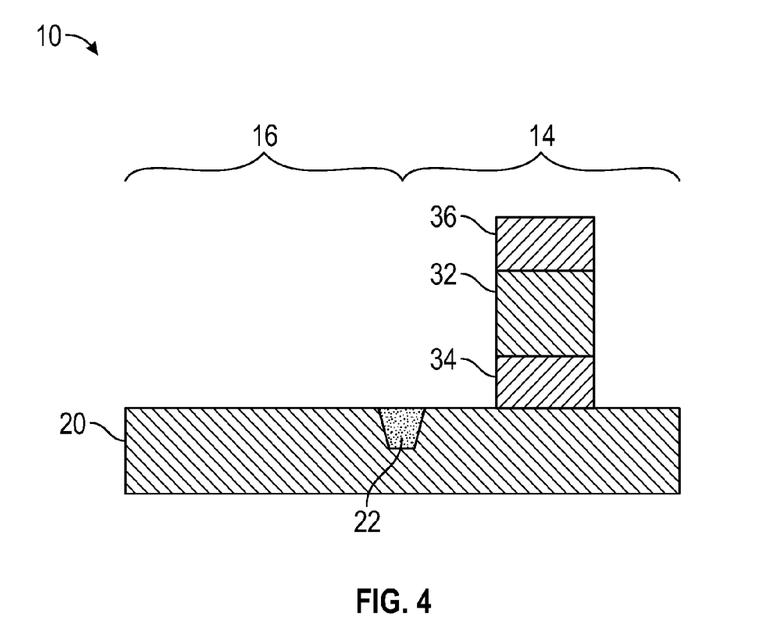

Referring to the exemplary embodiment in FIG. 4, the exposed portions of the conductor layer 28, the select layer 26, and the gate dielectric layer 24 are removed by etching. In an exemplary embodiment, the conductor layer 28, the select layer 26, and the gate dielectric layer 24 are removed with a reactive ion etch process, such as a reactive ion etch process using hydrobromic acid and silicon tetrafluoride. The reactive ion etch process used to remove the select layer 26, as well as the conductor layer 28 and the gate dielectric layer 24, is referred to herein as the "select layer etch" or the "select layer etch process." The select layer etch process produces an off-gas, and the off-gas includes compounds removed from the various layers as they are etched away. In an exemplary embodiment, the concentration of an indicator is measured in the off-gas to determine when to terminate the select layer etch process, and the select layer etch process is terminated when the concentration of the indicator crosses an end point determination concentration. In an exemplary embodiment, the indicator is oxygen, where oxygen is produced when the silicon dioxide from the gate dielectric layer 24 is removed. As such, the select layer etch process may be terminated when the concentration of the oxygen in the off-gas falls below the end point determination concentration, such as an end point determination concentration of about 0.001 moles per liter. Other indicators may be used in alternate embodiments.

The concentration of the indicator in the off-gas may start at about zero, such at the beginning of the select layer etch process where the conductor layer 28 is being removed, because the conductor layer may not include oxygen at such a low concentration that oxygen is below the detection limits for an off-gas detector. In an exemplary embodiment, the concentration of the indicator may remain at about zero as polysilicon in the select layer 26 is removed, and the concentration of the indicator (oxygen) may increase to a point above the end point determination concentration when silicon dioxide from the gate dielectric layer 24 is removed. Once the gate dielectric layer 24 is removed, the concentration of the oxygen (i.e. the indicator) will again fall to below the end point determination concentration, so the end point may be determined by the concentration of the indicator crossing the end point determination concentration in a specific direction (e.g., from a higher concentration to a lower concentration instead of from a lower concentration to a higher concentration). As such, determination of the end point may not depend strictly on the concentration of the indicator being above or below the end point determination concentration. In alternate embodiments, different materials can be used as the indicator.

Referring to FIGS. 1 and 3 with continuing reference to FIG. 4, the portions of the conductor layer 28, the select layer 26, and the gate dielectric layer 24 that are exposed by the patterning of the select photoresist 30 are removed, and so the area of the portions of the conductor layer 28, the select layer 26, and the gate dielectric layer 24 that are removed may be about 20 percent or more of the integrated circuit area 12 in some embodiments, or about 10 percent or more of the integrated circuit area 12 or about 30 percent of the integrated circuit area 12 in alternate embodiments. The patterning of the select photoresist 30 exposes enough of the conductor layer 28, the select layer 26, and the gate dielectric layer 24 that selective etching of the conductor, select, and gate dielectric layers 28, 26, 24 produces a sufficient concentration of the indicator to measure and reliably detect an end point for the select layer etch process. A portion of the select layer 26 that remains after the select layer etch process is a select gate 32, and the select gate 32 overlies a gate dielectric 34 and underlies a gate conductor 36. Any remaining portions of the select photoresist 30 may be removed after use (i.e., after selectively etching the conductor layer 28, the select layer 26, and the gate dielectric layer 24), such as with an oxygen containing plasma. In the same manner, any remaining hard mask (not illustrated) and/or antireflective layer (not illustrated) may be selectively removed after use. In an exemplary embodiment with a silicon nitride hard mask, the hard mask may be removed with a wet etch using hot phosphoric acid. The end point detection using a measurement of the concentration of the indicator allows for a more controlled and accurate select layer etch to form the select gate 32, and this improved control can help minimize or prevent over or under etching and the associated damage.

Figure 5:
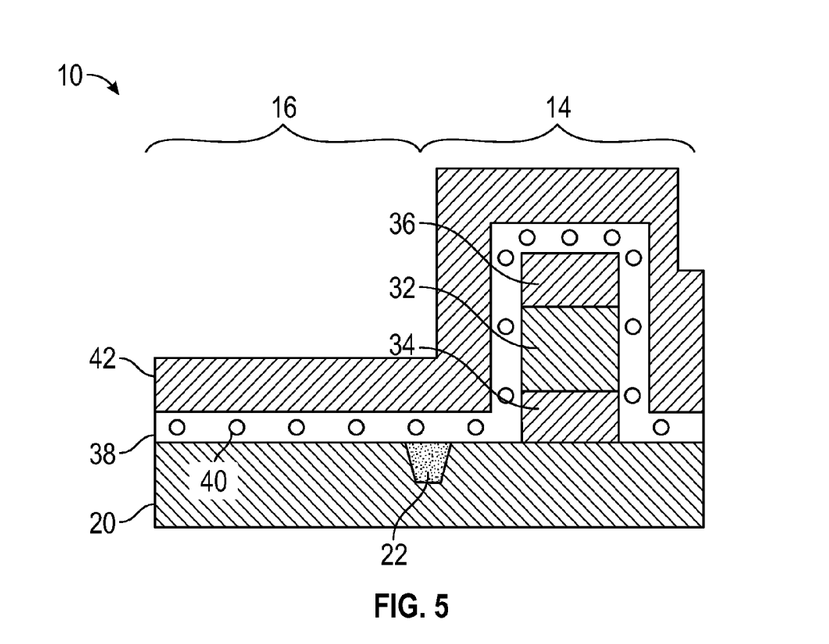

Referring now to an embodiment as shown in FIG. 5, a memory layer 38 is formed overlying the select gate 32 and the substrate 20. In an exemplary embodiment, a bottom dielectric layer (not individually illustrated) including oxynitride is uniformly deposited overlying the select gate 32 and the substrate 20, such as by plasma enhanced chemical vapor deposition using nitrous oxide and silane. Nanocrystals 40 are then formed on the bottom dielectric layer. Amorphous silicon may be deposited on the bottom dielectric layer, such as by chemical vapor deposition, plasma enhanced chemical vapor deposition, or sputtering. In one exemplary embodiment, the amorphous silicon is deposited by chemical vapor deposition at about 300° C. to about 550° C. for about 10 to 150 seconds in an ambient of nitrogen and disilane at a ratio of disilane to nitrogen of about 11/5,000. The amorphous silicon is then annealed, such as by heating to from about 600° C. to about 1,050° C. for about 1 to 60 seconds in a nitrogen ambient, to form a plurality of nanocrystals 40. A second anneal, such as from about 300° C. to about 1,050° C. for about 1 to 60 seconds in an oxygen ambient, is then performed to reduce the number of small nanocrystals 40, because some of the smaller nanocrystals 40 will either fully oxidize or be absorbed by another nanocrystal 40 to increase in size. Silicon (not individually illustrated) is then deposited overlying the nanocrystals 40 and the bottom dielectric layer, such as by chemical vapor deposition at about 300° C. to about 550° C. for about 10 to 150 seconds in an ambient of nitrogen and disilane with a concentration ratio of disilane to nitrogen of about 11/5,000. Another anneal is performed to promote absorption of the silicon by the existing nanocrystals 40, such as by heating from about 600° C. to about 1,050° C. for about 1 to 60 seconds in a nitrogen ambient. This is followed by another anneal to grow a nanocrystal dielectric surface layer (not individually illustrated) of silicon oxide around the nanocrystals 40, such as by heating from about 300° C. to about 1,050° C. for about 1 to 60 seconds in an oxygen ambient. The resulting nanocrystals 40 may be about 0.1 to about 50 nanometers in diameter, and are encased in the nanocrystal dielectric surface layer.

A top dielectric layer (not individually illustrated) may then be deposited overlying the bottom dielectric layer and the nanocrystals 40. A wide variety of dielectric materials can be used in the top dielectric layer, including but not limited to silicon dioxide, silicon nitride, or other insulating materials such as high dielectric materials (high K materials). In an exemplary embodiment, a top dielectric layer of silicon oxide is deposited by chemical vapor deposition using silane in an oxygen ambient. The top dielectric layer overlies the nanocrystals 40, but also fills the space between adjacent nanocrystals 40 such that the nanocrystals 40 are encased in dielectric material. The dielectric materials and the nanocrystals 40 form the memory layer 38. A control layer 42 may then be formed over the memory layer 38. In some embodiments, the control layer 42 includes polysilicon, as described above.

Figure 6:
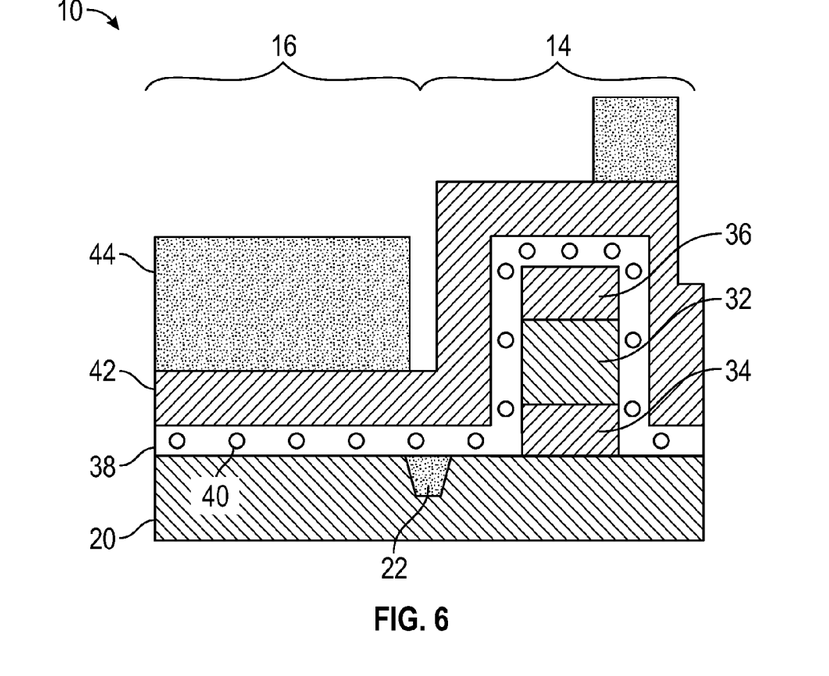
Figure 7:
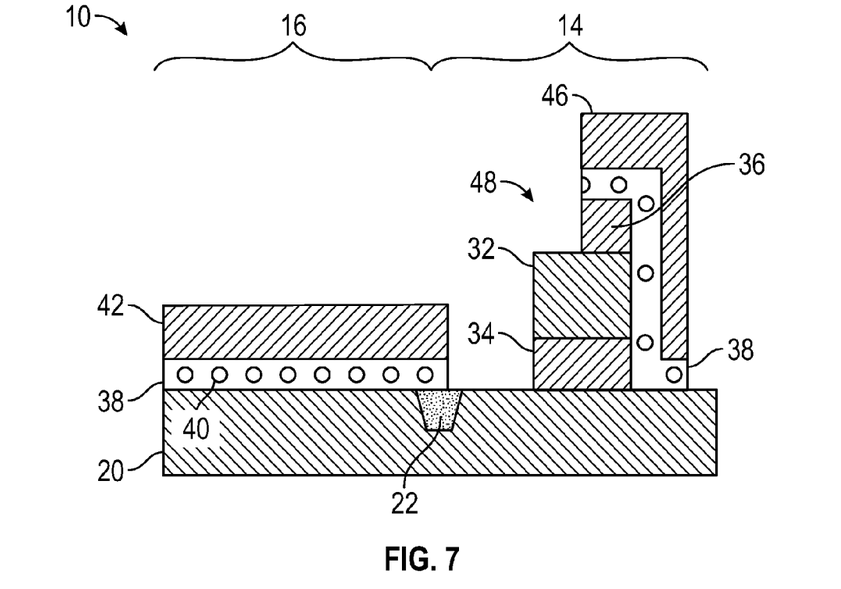

Referring to the exemplary embodiment in FIG. 6, a control photoresist 44 is formed overlying the control layer 42, and the control photoresist 44 is then patterned as described above. One or more antireflective layers and/or hard mask layers (not illustrated) may be used in conjunction with the control photoresist 44, as mentioned above. The control photoresist 44 is patterned to directly overlie a portion of the select gate 32, but to expose another portion of the select gate 32. The control photoresist 44 may be formed to cover the control layer 42 in the dummy area 16. Referring to the embodiment in FIG. 7, with continuing reference to FIG. 6, the control layer 42, the memory layer 38, and the portion of the conductor layer 28 overlying the select gate 32 may be removed in the areas that are not covered by the control photoresist 44 or an associated hard mask (not illustrated), such as with a reactive ion etch using hydrogen bromide and silicon tetrafluoride, but other etchants may be used in alternate embodiments. The control photoresist 44 and any associated antireflective layers and/or hard masks may be removed after use, as described above. A control gate 46 is formed with the removal of the control layer 42 from over part of the select gate 32, thus producing a memory cell 48, where the memory cell 48 includes the select gate 32, the control gate 46, the gate dielectric 34, the memory layer 38 positioned between the select gate 32 and the control gate 46, and the gate conductor 36 positioned between the select gate 32 and the control gate 46.

Figure 8:
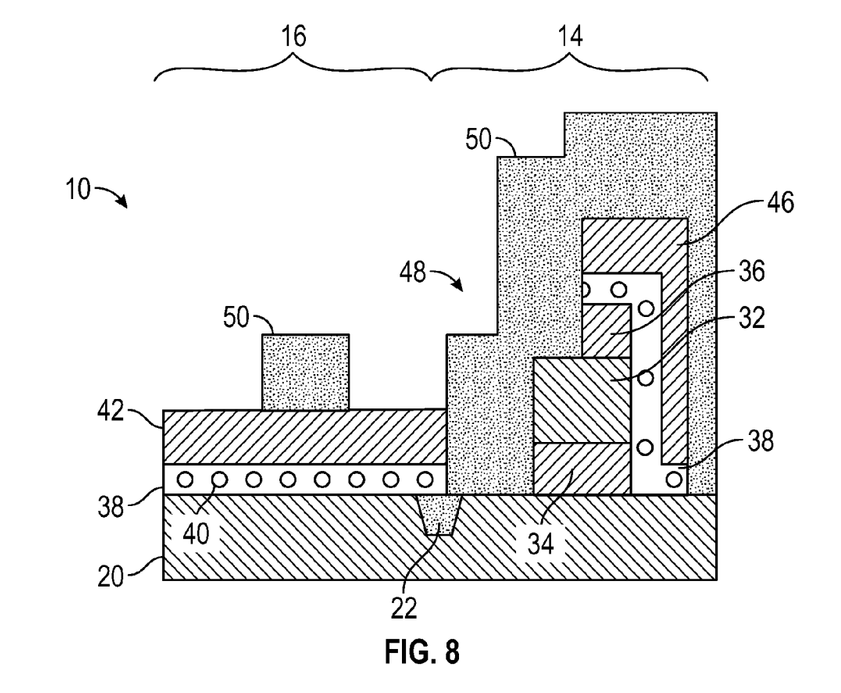
Figure 9:
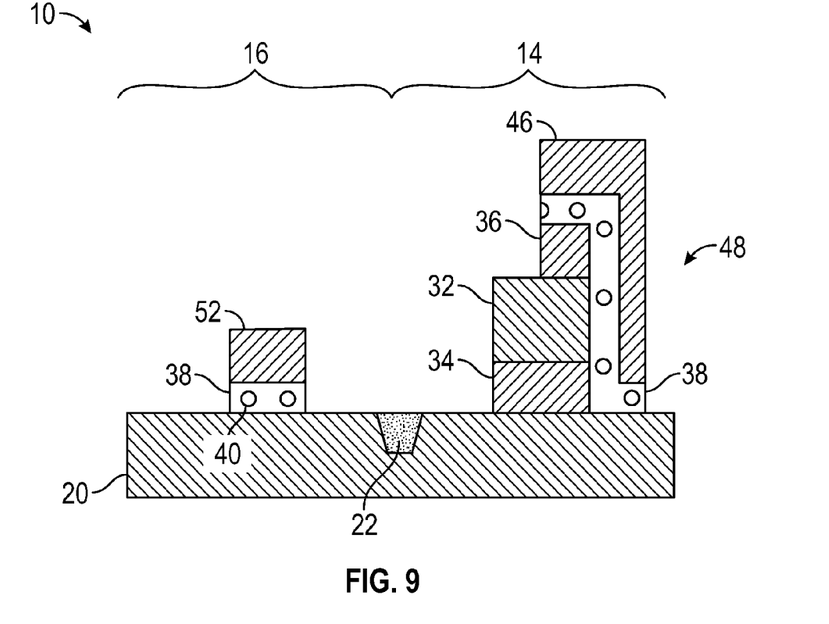

A dummy photoresist 50 may be formed and patterned overlying the memory cell and a portion of the control layer 42 in the dummy area 16, as illustrated in an exemplary embodiment in FIG. 8. The dummy photoresist 50 is patterned to expose a portion of the control layer 42 in the dummy area 16 such that a dummy gate 52 can be formed in the dummy area 16, as illustrated in an exemplary embodiment in FIG. 9, where the dummy gate 52 is formed by removing the exposed portions of the control layer 42 and the underlying memory layer 38, as described above. As such, a portion of the memory layer 38 with nanocrystals 40 is positioned between the dummy gate 52 and the substrate 20 in the dummy area 16. The dummy gate 52 may be used to better balance production processes, such as chemical mechanical planarization processes, but the dummy gate 52 is not used as an electronic component in the integrated circuit 10 in many embodiments. In the embodiment described above, the dummy gate 52 is formed after the select gate 32. The memory cell 48 can then be incorporated into the integrated circuit 10 using known techniques.

Figure 10:
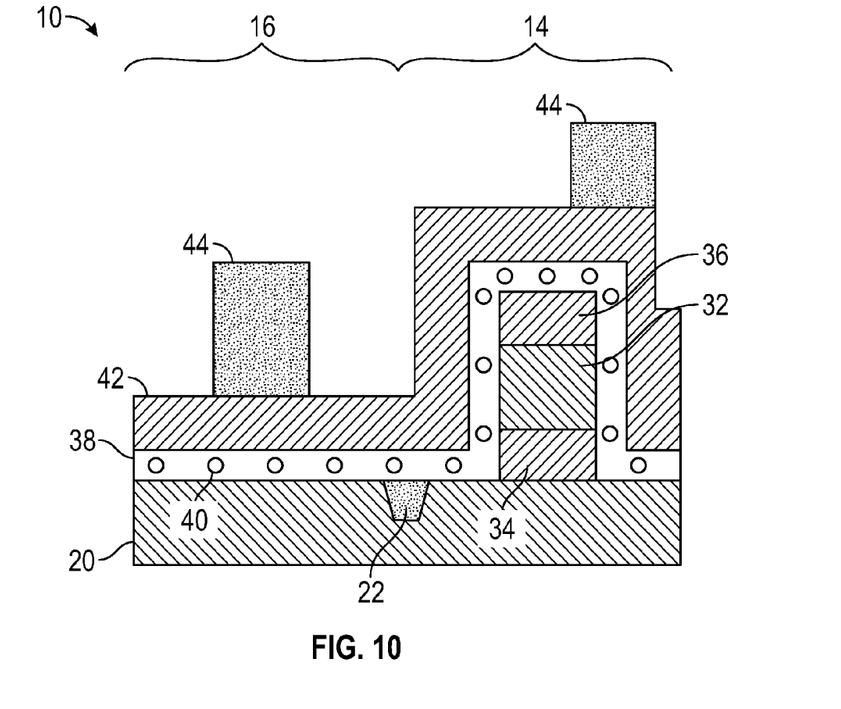
Figure 11:
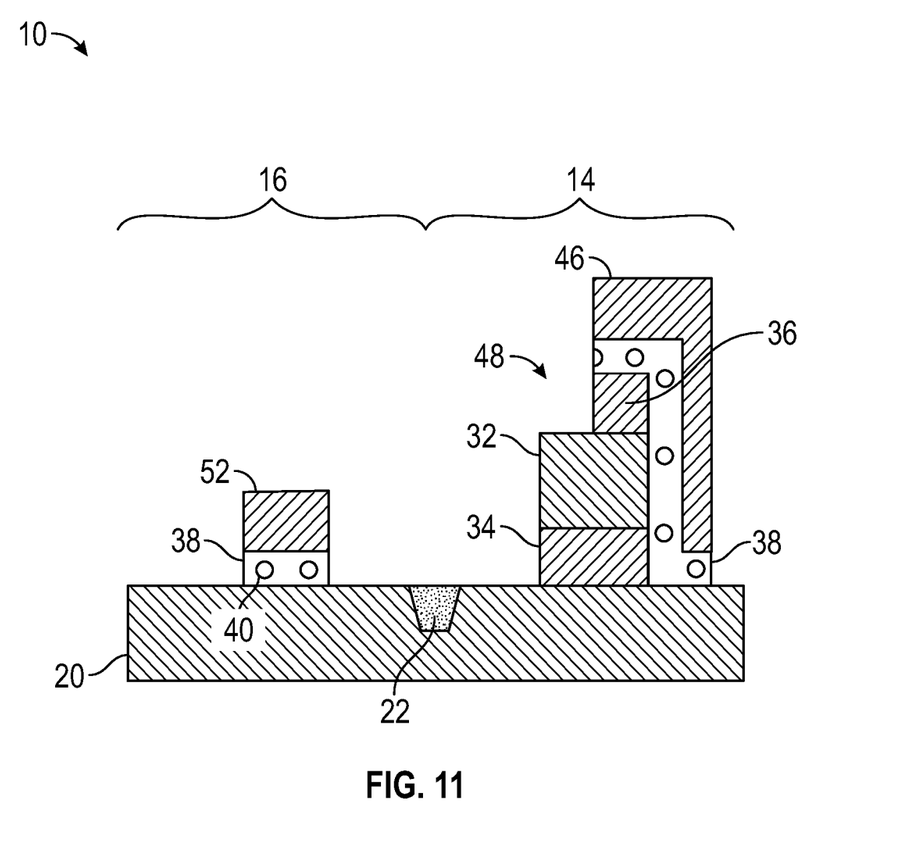

An alternate embodiment of forming the dummy gate 52 is illustrated in FIGS. 10 and 11, where FIG. 10 illustrates an alternate patterning of the control photoresist 44 previously illustrated in FIG. 6. In this embodiment, the control photoresist 44 is patterned to form the control gate 46 and the dummy gate 52 at the same time, so the etch process that forms the control gate 52 also forms the dummy gate 52. The resulting memory cell 48 and dummy gate 52 is illustrated in FIG. 11, where FIG. 11 is the same as FIG. 9.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   determining a memory area of the integrated circuit;
   forming a select layer overlying a substrate;
   selectively etching a portion of the select layer to form a select gate, wherein the select gate is within the memory area;
   measuring a concentration of an indicator in an etch off-gas during the selective etching of the select layer; and terminating the selective etching of the select layer when a change in the concentration of the indicator crosses an end point determination concentration.

2. The method of claim 1 further comprising forming a non-volatile memory cell in the memory area, wherein the non-volatile memory cell comprises the select gate.

3. The method of claim 1 wherein measuring the concentration of the indicator comprises measuring a concentration of oxygen in the etch off-gas.

4. The method of claim 3 wherein terminating the selective etching of the select layer comprises determining when the concentration of oxygen in the etch off-gas falls below the end point determination concentration.

5. The method of claim 1 wherein:
measuring the concentration of the indicator comprises measuring a concentration of oxygen in the etch off-gas, wherein the concentration of oxygen in the etch off-gas increases from below the end point determination concentration to above the end point determination concentration during the selective etching; and
terminating selective etching of the select layer comprises terminating selective etching of the select layer when the concentration of oxygen in the etch off-gas falls below the end point determination concentration after the concentration of oxygen in the etch off-gas increased from below the end point determination concentration to above the end point determination concentration.

6. The method of claim 1 wherein etching the select layer comprises removing the select layer from a dummy area of the integrated circuit, wherein the dummy area is different than the memory area of the integrated circuit.

7. The method of claim 6 wherein etching the select layer comprises removing the select layer from at least about 20 percent of a substrate area.

8. The method of claim 6 further comprising forming a dummy gate overlying the substrate in the dummy area.

9. The method of claim 8 wherein forming the dummy gate comprises forming the dummy gate after forming the select gate.

10. The method of claim 8 further comprising:
forming a memory layer overlying the substrate prior to forming the dummy gate such that the dummy gate overlies the memory layer.

11. The method of claim 1 wherein determining the memory area comprises determining the memory area that is less than about 20 percent of a substrate area.

12. The method of claim 1 wherein etching the select layer to form the select gate further comprises removing a gate dielectric layer after etching the select layer.

13. The method of claim 1 further comprising:
forming a memory layer overlying select gate; and
forming a control gate wherein the memory layer is between the select gate and the control gate.

14. A method of producing an integrated circuit comprising:
determining a memory area and a dummy area of the integrated circuit;
forming a select layer overlying a substrate, wherein the select layer overlies the memory area and the select layer overlies the dummy area;
removing a portion of the select layer to form a select gate in the memory area with a selective etch, wherein the select layer is simultaneously removed from at least a portion of the dummy area;
measuring a concentration of an indicator in an etch off-gas during the selective etch;
terminating the selective etch when a change in the concentration of the indicator crosses an end point determination concentration; and
forming a non-volatile memory cell wherein the non-volatile memory cell comprises the select gate.

15. The method of claim 14 wherein removing the portion of the select layer comprises removing the select layer from at least about 20 percent of a substrate area.

16. The method of claim 15 wherein determining the memory area comprises determining the memory area wherein the memory area is less than about 20 percent of the substrate area.

17. The method of claim 14 further comprising:
forming a memory layer overlying the substrate; and
forming a dummy gate within the dummy area, wherein the dummy gate overlies the memory layer.

18. The method of claim 17 wherein forming the memory layer comprises forming nanocrystals within the memory layer.

19. The method of claim 17 further comprising forming a control gate simultaneously with the dummy gate, wherein the non-volatile memory cell comprises the control gate.

* * * * *